(12) United States Patent
Yang et al.

(10) Patent No.: US 10,225,936 B2
(45) Date of Patent: Mar. 5, 2019

(54) FLEXIBLE DISPLAY DEVICE AND ELECTRONIC DEVICE

(71) Applicant: SHENZHEN ROYOLE TECHNOLOGIES CO. LTD., Shenzhen (CN)

(72) Inventors: Songling Yang, Shenzhen (CN); Zihong Liu, Shenzhen (CN)

(73) Assignee: SHENZHEN ROYOLE TECHNOLOGIES CO., LTD., Shenzhen (CN)

(*) Notice: Subject to any disclaimer, the term of this patent is extended or adjusted under 35 U.S.C. 154(b) by 0 days.

(21) Appl. No.: 15/540,435

(22) PCT Filed: Dec. 31, 2014

(86) PCT No.: PCT/CN2014/096027
§ 371 (c)(1),
(2) Date: Jun. 28, 2017

(87) PCT Pub. No.: WO2016/106734
PCT Pub. Date: Jul. 7, 2016

(65) Prior Publication Data
US 2017/0374751 A1    Dec. 28, 2017

(51) Int. Cl.
*G06F 1/16* (2006.01)
*H05K 5/00* (2006.01)
*H05K 5/02* (2006.01)
*G06F 3/041* (2006.01)
*H04M 1/02* (2006.01)

(52) U.S. Cl.
CPC ......... *H05K 5/0017* (2013.01); *G06F 1/163* (2013.01); *G06F 1/1615* (2013.01); *G06F 1/1626* (2013.01); *G06F 1/1652* (2013.01); *G06F 1/1679* (2013.01); *H05K 5/0217* (2013.01); *G06F 3/041* (2013.01); *G06F 2203/04102* (2013.01); *H04M 1/0268* (2013.01)

(58) Field of Classification Search
None
See application file for complete search history.

(56) References Cited

U.S. PATENT DOCUMENTS 6,474,009 B2 * 11/2002 Hahn ................. G09F 1/10
                                                    24/460
8,009,421 B2 *  8/2011 Misawa ........... G02F 1/133305
                                                    345/156

(Continued)

FOREIGN PATENT DOCUMENTS

EP       2962294 A     1/2016
JP    2013257564 A    12/2013

*Primary Examiner* — Courtney L Smith
*Assistant Examiner* — Rashen E Morrison
(74) *Attorney, Agent, or Firm* — Hauptman Ham, LLP

(57) ABSTRACT

A flexible display device may include a display unit, and a support mechanism. The support mechanism may include multiple supporting units arranged at intervals in a direction of a side edge of the display unit and fixed to a second surface, and a movable unit. The supporting units respectively define holes that have openings facing toward each other and communicating with each other. The movable unit passes through the holes and is movable relative to the supporting units. The shape is changed by adjusting a position relationship between the movable unit and the supporting units.

18 Claims, 7 Drawing Sheets

(56) References Cited

U.S. PATENT DOCUMENTS

| | | | |
|---|---|---|---|
| 8,009,422 B2* | 8/2011 | Misawa | G02F 1/133305 345/156 |
| 9,625,946 B2* | 4/2017 | Lee | G06F 1/1652 |
| 9,697,941 B2* | 7/2017 | Lee | H01F 7/20 |
| 2004/0183958 A1* | 9/2004 | Akiyama | G02F 1/133305 349/58 |
| 2007/0241002 A1* | 10/2007 | Wu | G06F 1/1601 206/150 |
| 2008/0013292 A1* | 1/2008 | Slikkerveer | G06F 1/1601 361/749 |
| 2008/0212271 A1* | 9/2008 | Misawa | G02F 1/133305 361/679.01 |
| 2010/0072490 A1* | 3/2010 | Kerr | H01L 24/81 257/88 |
| 2010/0246113 A1* | 9/2010 | Visser | G06F 1/1601 361/679.3 |
| 2010/0311489 A1* | 12/2010 | Miller | A63F 1/12 463/16 |
| 2010/0311502 A1* | 12/2010 | Miller | A63F 1/02 463/30 |
| 2011/0043976 A1* | 2/2011 | Visser | G09F 9/00 361/679.01 |
| 2011/0227487 A1* | 9/2011 | Nichol | G02B 6/0018 315/158 |
| 2012/0212433 A1* | 8/2012 | Lee | G06F 1/1652 345/173 |
| 2013/0265262 A1* | 10/2013 | Jung | G06F 3/041 345/173 |
| 2014/0104244 A1 | 4/2014 | Baldwin | |
| 2014/0111549 A1 | 4/2014 | Vanska et al. | |
| 2014/0226266 A1 | 8/2014 | Kang et al. | |
| 2014/0226275 A1* | 8/2014 | Ko | G06F 1/1626 361/679.27 |
| 2015/0089974 A1* | 4/2015 | Seo | A44C 5/0076 63/1.13 |

* cited by examiner

FLEXIBLE DISPLAY DEVICE AND ELECTRONIC DEVICE

TECHNICAL FIELD

The present disclosure relates to the technical field of display, and particularly to a flexible display device and an electronic device having the flexible display device.

BACKGROUND

Currently, the common display devices include displays used by televisions, computers, cellphones, and so on. Such displays may be liquid crystal displays ("LCD" for short) or light emitting diode ("LED" for short) displays, etc. These displays inevitably have certain weight, thickness, and volume, and they are fixed in a certain place. Based on this, applications of three-dimensional display or touch display bring new feelings and experiences to users. Flexible display devices are opposite to the above display devices. A core component of a flexible display device is a flexible display. The flexible display has enormous application potential due to its characteristics of being light and thin, bendable, etc. How to improve the flexibility in the bending of the flexible display device becomes a technical problem that urgently needs to be addressed.

SUMMARY

An object of the present disclosure is to provide a flexible display device, which uses a movable unit to adjust a bending form of the flexible display device, aiming at solving the problem of how to improve the flexibility in bending of the flexible display device in the related art.

In a first aspect, the present disclosure provides a flexible display device which may include a display unit, and a support mechanism. The display unit may include a first surface for display and a second surface opposite to the first surface. The support mechanism may include multiple supporting units, and a movable unit. The supporting units are arranged at intervals in a direction of a side edge of the display unit and fixed to the second surface. The supporting units respectively define holes that have openings facing toward each other and communicating with each other. The movable unit passes through the holes and is movable relative to the supporting units. The shape of the display unit is changed by adjusting a position relationship between the movable unit and the supporting units.

In a second aspect, the present disclosure further provides an electronic device which may include a housing and a display device arranged opposite to the display device. The display device may include a display unit and a support mechanism. The display unit may include a first surface for display and a second surface opposite to the first surface. The support mechanism may include multiple supporting units, and a movable unit. The supporting units are arranged at intervals in a direction of a side edge of the display unit and fixed to the second surface. The supporting units respectively define holes that have openings facing toward each other and communicating with each other. The movable unit passes through the holes and is movable relative to the supporting units. The shape of the display unit is changed by adjusting a position relationship between the movable unit and the supporting units.

Technical effects of the present disclosure with respect to the related art are the follows: the movable unit passes through the holes and can be moved relative to the supporting units, and the shape of the display unit is changed by adjusting the position of the movable unit in the supporting units, so that the display unit is changed in bending degree.

BRIEF DESCRIPTION OF THE DRAWINGS

In order to illustrate the technical solutions of embodiments of the present disclosure more clearly, the accompanying drawings used in the description of the embodiments of the present disclosure or the prior art will be briefly described. Apparently, the accompanying drawings described in the following are some embodiments of the present disclosure, and a person skilled in the art can obtain other accompanying drawings without any creative effort.

DETAILED DESCRIPTION

Figure 1:
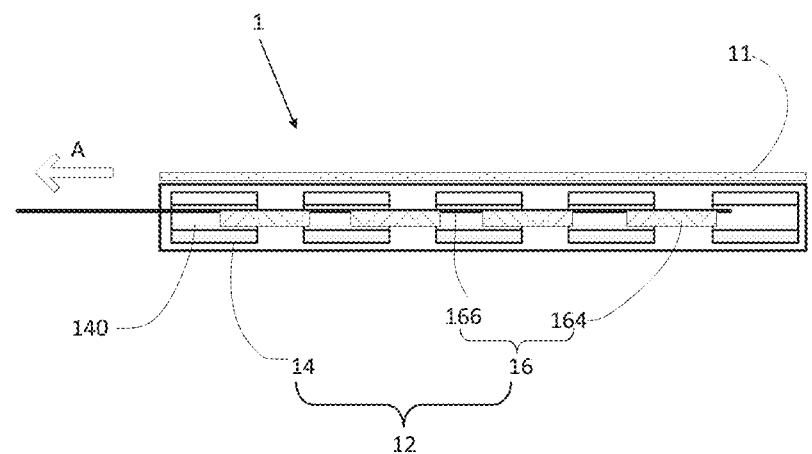
FIG. 1 is a structural schematic view showing a flexible display device in a state of straight-plate shape according to an embodiment of the present disclosure.

In order to make the objects, technical solutions, and advantages of the present disclosure clearer, below the present disclosure is further described in detail in combination with the accompanying drawings and embodiments. It shall be understood that the specific embodiments described herein are merely used to illustrate the present disclosure but not to limit the present disclosure.

Referring to FIG. 1 to FIG. 4, a flexible display device 1 provided in an embodiment of the present disclosure may include a display unit 11, and a support mechanism 12. The display unit 11 may include a first surface 110 for display and a second surface 112 opposite to the first surface 110. The support mechanism 12 may include multiple supporting units 14, and a movable unit 16. The supporting units 14 are arranged at intervals in a direction of a long side or a short side (i.e. side edge) of the display unit 11 and fixed to the second surface 112. The supporting units 14 respectively define holes 140 that have openings facing toward each other and communicating with each other. The movable unit 16 passes through the holes 140 and is movable relative to the supporting units 14. The shape of the display unit 11 is changed by adjusting a position relationship between the movable unit 16 and the supporting units 14.

For the flexible display device 1 provided in the embodiment of the present disclosure, the movable unit 16 passes through the holes 140 and can be moved relative to the supporting units 14, and the shape of the display unit 11 is changed by adjusting the position of the movable unit 16 in the supporting units 14, so that the display unit 11 can be changed in bending degree. Preferably, the bending degree may be that the display unit 11 is transformed from a bent arc shape to a straight-plate shape, or transformed from the straight-plate shape to the bent arc shape, and also may be a change of any curvature.

In the embodiment, the support mechanism 12 is arranged on the second surface 112.

In the embodiment, the display unit 11 may be fixedly connected to the supporting units 14, and the shape of the supporting units 14 are changed by adjusting the movable unit 16, so that the shape of the display unit 11 is changed, i.e., bent or normal plane display of the display unit 11 is realized. When the display unit 11 is in a bending state, it can be worn on a human body.

In the embodiment, the display unit 11 may be a flexible display, for example, an OLED flexible display. Alternatively, the display unit 11 may a flexible touch display.

Referring to FIG. 3 to FIG. 6, in the embodiment, the display unit 11 may include a first end portion 114, and a second end portion 116. When the display unit 11 is in the bending state, the first end portion 114 and the second end portion 116 get close to each other or are even connected to each other. When the display unit 11 is in a state of normal plane display, the first end portion 114 and the second end portion 116 are two opposite side edges of the display unit 11. The movable unit 16 may include a first end 160 corresponding to the first end portion 114 and a second end 162 adjacent to the second end portion 116. By adjusting the position of the second end 162 relative to the second end portion 116, the supporting units 14 drives the display unit 11 to be bent and deformed.

Figure 2:
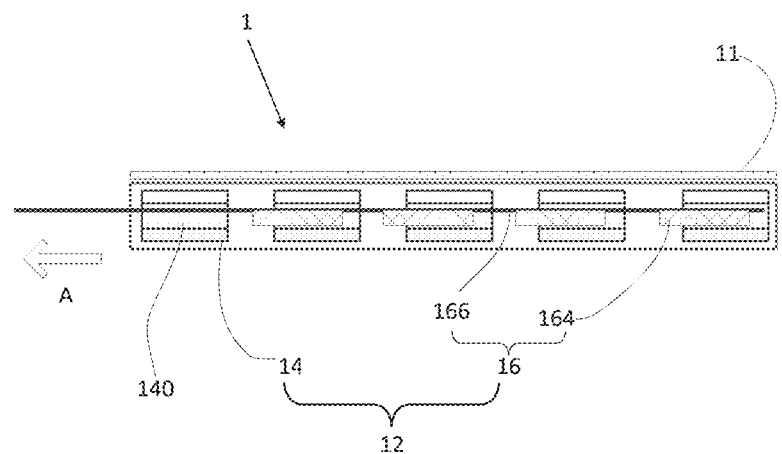
FIG. 2 is a structural schematic view showing a state of the flexible display device of FIG. 1 when in a bending deformation process.
Figure 3:
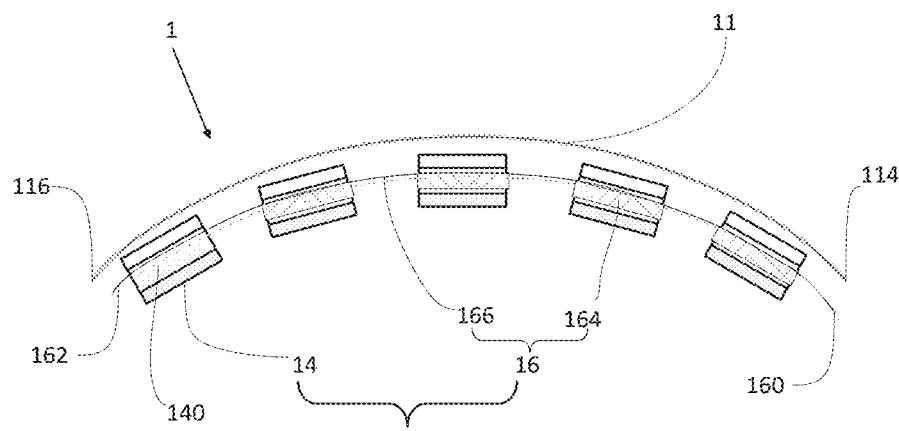
FIG. 3 is a structural schematic view showing the flexible display device of FIG. 1 in a bending state.

Referring to FIG. 1 to FIG. 3, furthermore, the movable unit 16 may include a flexible base 166, and multiple rigid elements 164. The flexible base 166 is made from a flexible material and arranged opposite to the display unit 11. The rigid elements 164 are arranged at intervals along the direction of the long side or the short side (i.e. a direction parallel to the supporting units 14) of the display unit 11 and fixedly connected to the flexible base 166. An interval between two adjacent supporting units 14 is smaller than the width of the rigid element 164 in the interval direction. It can be understood that the rigid elements 164 correspond to the supporting units 14, and an arrangement direction of the rigid elements 164 is the same as that of the supporting units 14, i.e., the rigid elements and the supporting units are arranged at intervals along the direction of the long side or the direction of the short side of the display unit 11. Specifically, when the rigid elements 164 and the supporting units 14 are arranged at intervals along the direction of the long side of the display unit 11, the display unit 11 may be suitable to be worn on a human body after being bent, as shown in FIG. 3. When the rigid elements 164 and the supporting units 14 are arranged at intervals along the direction of the short side of the display unit 11, the display unit 11, after being bent, may occupy a smaller space and is easy to be held.

In the embodiment, the flexible base 166 is fixedly connected between the rigid elements 164, so that the movable unit 16 is integrally provided. In other embodiments, the flexible base 166 is integrally provided in a sheet shape, and the rigid elements 164 are arranged at intervals on the flexible base 166.

Figure 13:
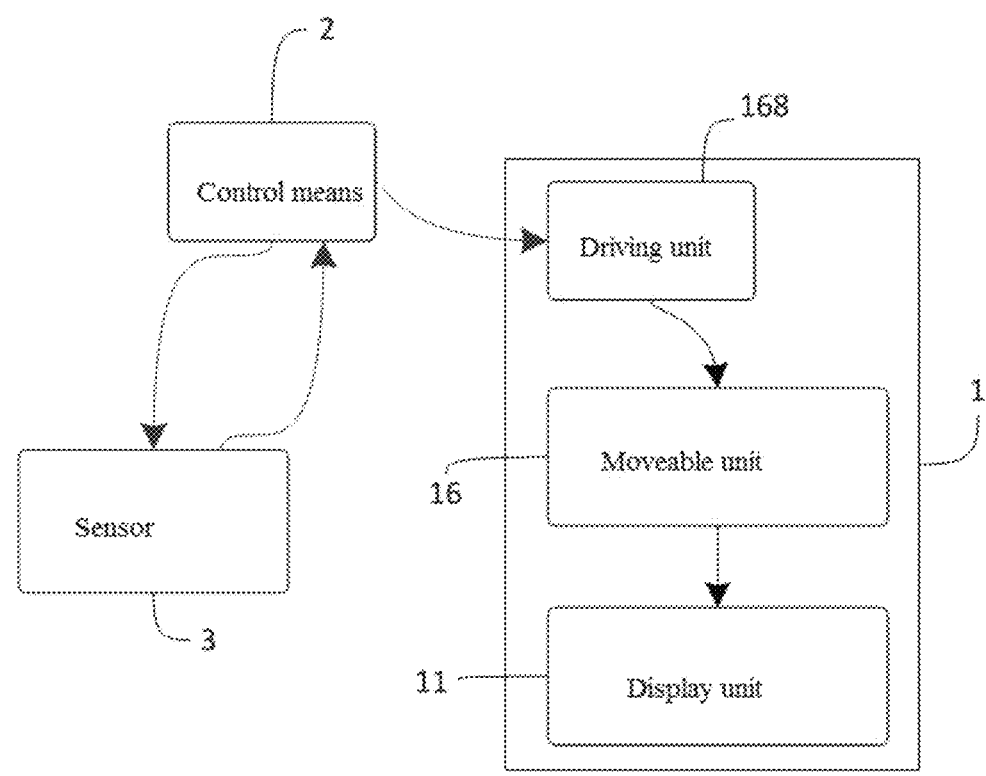
FIG. 13 is a structural block diagram of an electronic device according to an embodiment of the present disclosure.

Referring to FIG. 1 to FIG. 3, FIG. 5, and FIG. 6, preferably, the movable unit 16 may further include a driving unit 168, as shown in FIG. 13, arranged at a distal end of the flexible base 166 to pull the flexible base 166 to move the rigid elements 164 relative to the supporting units 14. It can be understood that the driving unit 168 is connected to the second end 162 of the movable unit 16 and drives the second end 162 to move relative to the second end of the display unit 11, so that the rigid elements 164 are received in the holes 140 or drawn out from the holes 140.

Figure 8:
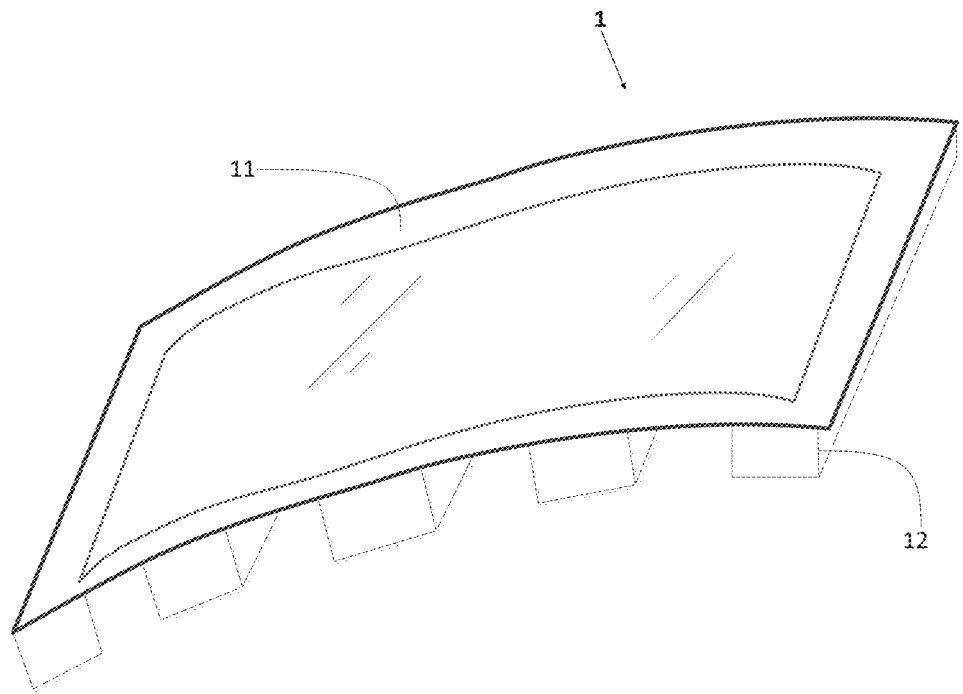
FIG. 8 is a structural schematic view showing a flexible display device in a bending state according to an embodiment of the present disclosure.
Figure 9:
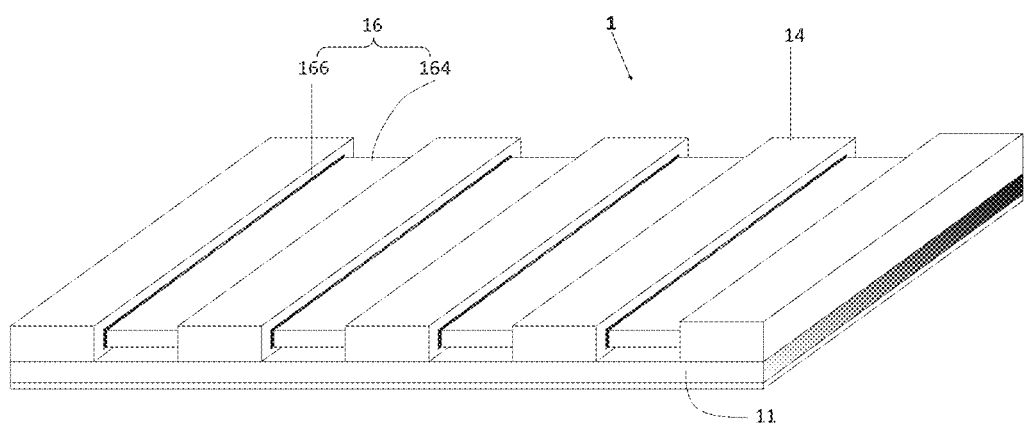
FIG. 9 is a structural schematic view showing a flexible display device in a state of straight-plate shape according to an embodiment of the present disclosure.

Referring to FIG. 1, FIG. 3, and FIG. 8, furthermore, when the rigid elements 164 are correspondingly received in the holes 140, the bending degree of the flexible display device 1 can be changed. It can be understood that the movable unit 16 is moved relative to the supporting units 14 by pulling the second end 162 of the movable unit 16, and when the flexible base 166 is pulled continuously, the rigid elements 164 are fully received in the holes 140, thus, the display unit 11 can be bent and deformed, for example, transformed from the state of straight-plate shape to the state of bent arc shape to be suitable for wearing.

Referring to FIG. 3, preferably, an end of the movable unit 16 is fixed to an end of the display unit 11, and another end of the movable unit 16 is in a free state. The flexible base 166 is elastically stretchable and shrinkable. It can be understood that the first end 160 of the movable unit 16 is fixed to the first end portion 114 of the display unit 11, and the second end 162 is in a free state. Under the pulling effect of the driving unit 168 to the second end 162, since the flexible base 166 can be elastically stretched, the length of the flexible base 166 in the supporting units 14 becomes short, so that the supporting units 14 drive the display unit 11 to be bent and deformed. On the contrary, the display unit 11 is in the state of normal plane display.

Referring to FIG. 1, FIG. 2, and FIG. 8, preferably, both ends of the movable unit 16 are in a free state. It can be understood that both the first end 160 and the second end 162 are in a free state. When the driving unit 168 pulls either of the first end 160 and the second end 162, the movable unit 16 is moved parallelly in the supporting units 14 along a direction A, so that the rigid elements 164 are fully received in the holes 140. Thus, the display unit 11 can be bent and deformed, for example, transformed from the state of straight-plate shape to the state of bent arc shape to be suitable for wearing.

Referring to FIG. 1, FIG. 2, FIG. 7, and FIG. 9, furthermore, when two opposite sides of each of the rigid elements 164 are received in the holes 140 of two adjacent supporting units 14, the bending degree of the flexible display device 1 remains unchanged. It can be understood that when the second end 162 of the movable unit 16 is pulled, two opposite sides of each of the rigid elements 164 are respectively received in the holes 140 of two adjacent supporting units 14, i.e., each of the rigid elements 164 is lapped on two adjacent supporting units 14, thus, the bending degree of the display unit 11 remains unchanged, for example, the display unit 11 is in the state of straight-plate shape before and after being pulled.

Referring to FIG. 3 to FIG. 6, furthermore, a distance between two adjacent supporting units 14 is determined by the curvature in which the flexible display device 1 is to be bent. It can be understood that, for example, for the bending curvature of the flexible display device 1, the curvature radius in the middle is bigger than the curvature radius at both ends. Since the supporting units 14 are fixed onto the display unit 11, an interval between two adjacent supporting units 14 in the middle is smaller than that between two adjacent supporting units 14 at both ends. Specifically, for a position where the curvature radius is big, an interval between corresponding two adjacent supporting units 14 is small. For a position where the curvature radius is small, an interval between corresponding two adjacent supporting units 14 is big.

Figure 4:
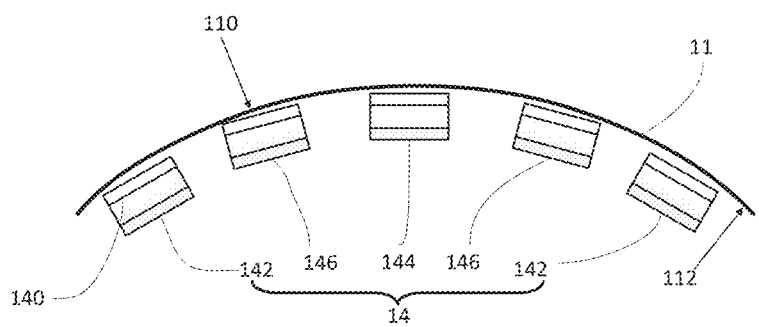
FIG. 4 is a structural schematic view of a display unit and supporting units of FIG. 1.
Figure 5:
FIG. 5 is a structural schematic view showing a movable unit of FIG. 1 in a state of straight-plate shape.
Figure 6:
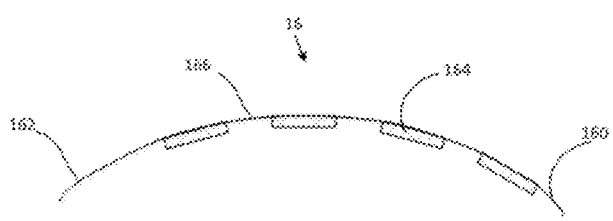
FIG. 6 is a structural schematic view showing the movable unit of FIG. 1 in a bending state.
Figure 7:
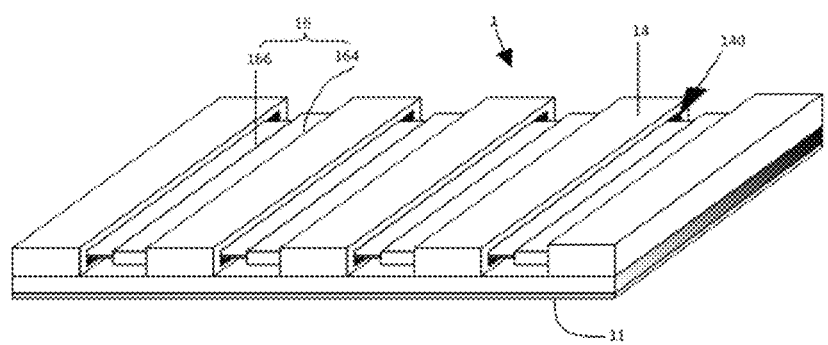
FIG. 7 is a structural schematic view showing a flexible display device in a deformation process according to an embodiment of the present disclosure.

Referring to FIG. 4, preferably, the distances between two adjacent supporting units 14 are set to gradually increase from the middle to both ends of the display unit 11. It can be understood that the bending curvature of the flexible display device 1 is changed gradually, i.e., the curvature gradually increases from the middle to both ends of the flexible display device, then the distances between corresponding two adjacent supporting units 14 are set to gradually increase, thus continuity and reliability of bending can be effectively ensured.

Referring to FIG. 3, optionally, the supporting units 14 and the rigid elements 164 are corresponding to each other, and the distance between two adjacent supporting units 14 is the same as that between corresponding two adjacent rigid elements 164. It can be understood that when the display unit 11 is in the bending state, the rigid elements 164 are fully received in the holes 140 and correspond to the supporting units 11. The distance between two adjacent supporting units 14 is the same as that between corresponding two adjacent rigid elements 164, and the changing of the intervals fulfills that the intervals gradually increase from the middle to both ends along the bending direction of the display unit 11.

Referring to FIG. 3 and FIG. 4, furthermore, the supporting units 14 at least include two first supporting blocks 142 and a second supporting block 144. The two first supporting blocks 142 are located at two opposite side edges of the display unit 11. The second supporting block 144 is arranged between the two first supporting blocks 142 and arranged in a middle position of the long side or the short side. It can be understood that the first supporting blocks 142 are arranged to be symmetrical with respect to the second supporting block 144. The first supporting blocks 142 and the second supporting block 144 are used to form a track for movement of the movable unit 16, so as to facilitate deforming the display unit 11. By providing one first supporting block 142 at each of both sides of the display unit 11 and providing one second supporting block 144 in the middle position of the display unit 11, thus, it can be ensured that the display unit 11 is not prone to breakage or wrinkle during the bending deformation process, so as to ensure continuity of bending deformation.

Referring to FIG. 3 and FIG. 4, preferably, the supporting unit 14 may further include at least one third supporting block 146 arranged between the first supporting blocks 142 and the second supporting block 144. The first supporting blocks 142 are arranged to be symmetrical with respect to the second supporting block 144, and the second supporting blocks 146 are arranged to be symmetrical with respect to the second supporting block 144. In order to further enhance the continuity of the bending deformation of the display unit 11, at least one third supporting block 146 is arranged between the first supporting block 142 and the second supporting block 144, and the intervals between supporting blocks conform to the above law of setting the intervals between the supporting units 14. Optionally, the distance between the first supporting block 142 and the third supporting block 146 is larger than the distance between the second supporting block 144 and the third supporting block 146.

Figure 10:
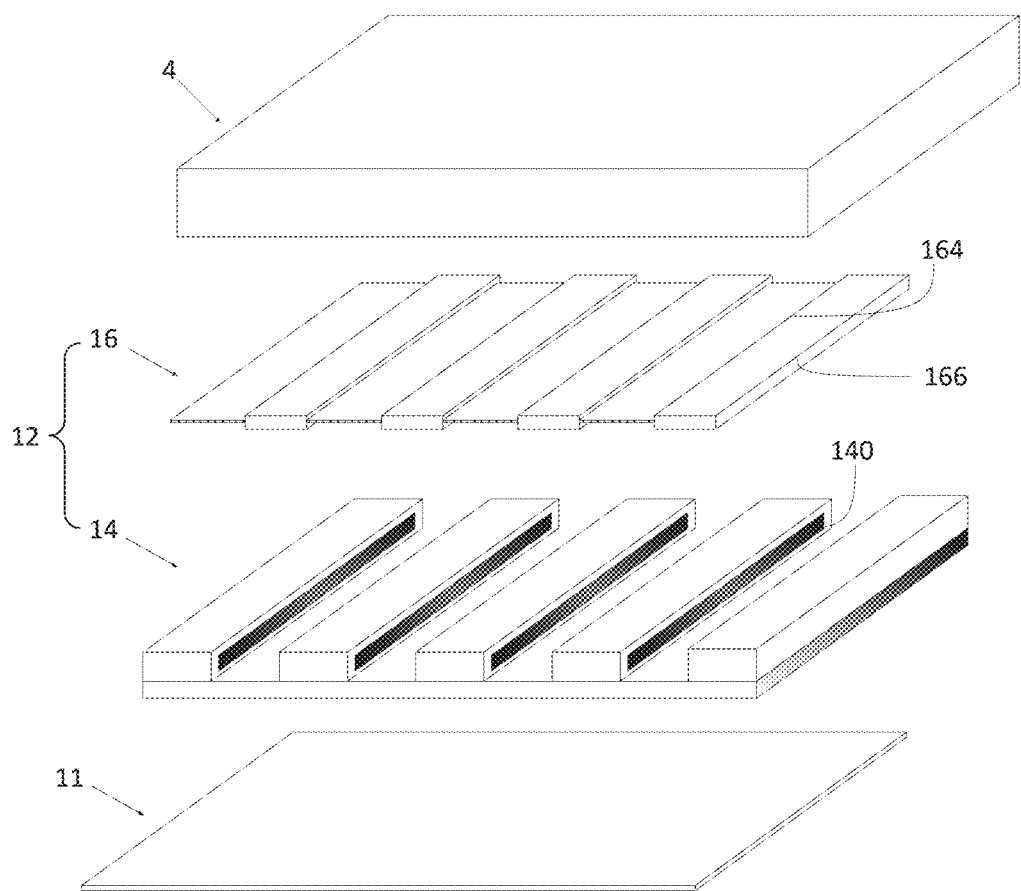
FIG. 10 is an exploded view of an electronic device according to an embodiment of the present disclosure.

Referring to FIG. 10, an embodiment of the present disclosure further provides an electronic device. The electronic device may include a housing 4, and the above flexible display device 1. The housing 4 is opposite to the display unit 11 to define a receiving cavity. The support mechanism 12 is arranged in the receiving cavity. The flexible display device 1 has the same structure and connection relationship as the flexible display devices 1 in the above various embodiments, and has the same function and effect, while unnecessary details will not be given herein.

Referring to FIG. 13, furthermore, the electronic device may further include a control means 2 electrically coupled to the flexible display device 1. The control means 2 transmits a control signal generated by the control means 2 to the flexible display device 1 to change the shape of the flexible display device 1. It can be understood that the control means 2 controls on and off of the driving unit 168. The control signal generated by the control means 2 is used to switch on the driving unit 168, and the driving unit 168 is used to drive the movable unit 16 to move relative to the supporting units 14, so that the shape of the flexible display device 1 is changed. Thus, the flexible display device 1 is transformed from a bending arc shape to a straight-plate shape or from the straight-plate shape to the bending arc shape.

Referring to FIG. 13, preferably, the electronic device may further include a sensor 3 electrically coupled to the control means 2. The sensor 3 generates a sensing signal and transmits the sensing signal to the control means 2. The control means 2 transmits a corresponding control signal to the flexible display device 1 based on the sensing signal. Optionally, the sensor 3 is a touch module, or a shooting means, or a pressure sensor.

Figure 11:
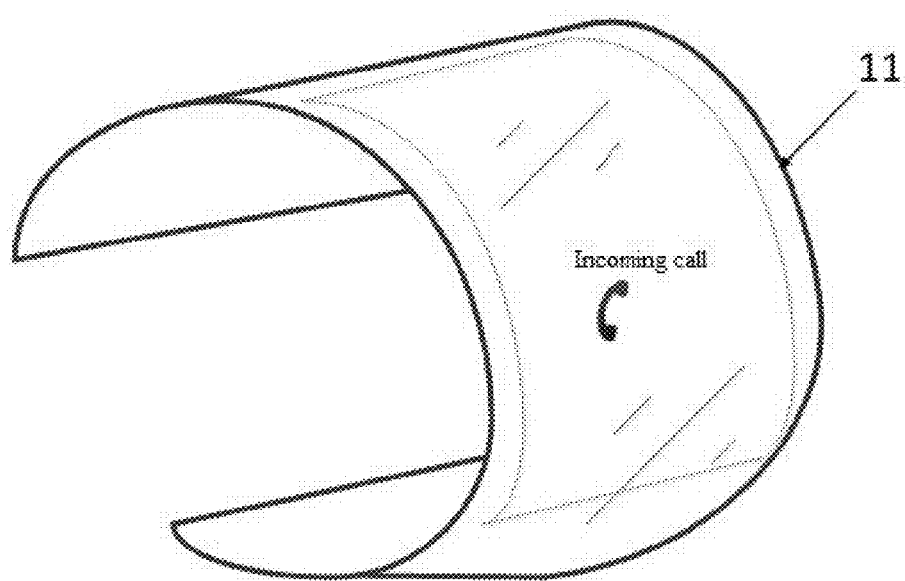
FIG. 11 is a schematic view showing the electronic device in a bending state according to an embodiment of the present disclosure.
Figure 12:
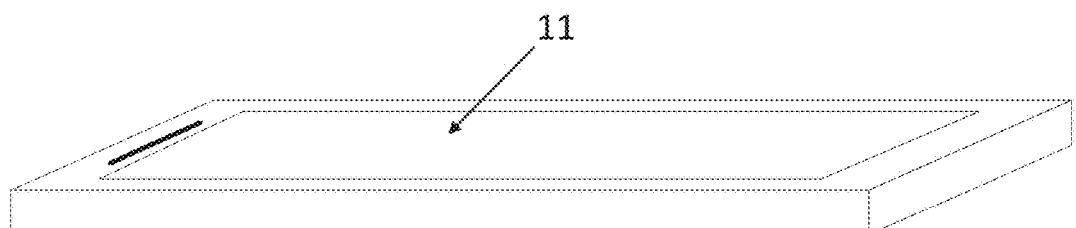
FIG. 12 is a schematic view showing the electronic device in a state of straight-plate shape according to an embodiment of the present disclosure.

Referring to FIG. 13, for example, when the electronic device is a cellphone, if the electronic device has an incoming call, after a user presses down an answer button, the control means 2 will generate a control signal. The control signal is transmitted to the flexible display device 1 and further transmitted to the driving unit 168, so that the driving unit 168 is switched on to drive the movable unit 16 to move relative to the supporting unit 14, thus the display unit 11 is driven to be changed in shape, i.e., the electronic device is transformed from a state of bent arc shape to a state of straight-plate shape, so as to facilitate answering the cellphone, as shown in FIG. 12. On the contrary, when the user presses down an end-call button, the control means will generate another control signal. The control signal is transmitted to the flexible display device 1 and further transmitted to the driving unit 168, so that the driving unit 168 is switched on to drive the movable unit 16 to move relative to the supporting units 14, thus the display unit 11 is driven to be changed in shape, i.e., the electronic device is transformed from the state of straight-plate shape to the state of bent arc shape to form a circular band for easy wearing, as shown in FIG. 11. Alternatively, the sensor 3 can be arranged in a particular sensing area. When the electronic device is in the straight-plate shape and the display unit 11 faces downwards, and when a hand touches the touch module, or presses the pressure sensor, or the shooting means senses approaching of the hand, the sensor 3 generates a sensing signal indicating that the flexible display device needs to be bent. The control means 2 controls the flexible display device 1 to be bent upwards based on the sensing signal. At this point, since the hand has approached the electronic device, the bent electronic device is automatically worn on the hand.

In the above embodiments, the electronic device 1 is in the state of straight-plate shape when it is not deformable, however, a person skilled in the art shall know that it is not limited to the state of straight-plate shape, while it also can be in a bending state, as practically required.

The above-mentioned descriptions are merely for preferable embodiments of the present disclosure and not used to limit the present disclosure. Any modifications, equivalent substitutions, improvements and so on, made within the spirit and principle of the present disclosure, shall be covered by the scope of protection of the present disclosure.

What is claimed is:

1. A flexible display device, comprising:
    a display unit comprising a first surface for display and a second surface opposite to the first surface;
    a support mechanism comprising:
    a plurality of supporting units arranged at intervals in a direction of a side edge of the display unit and fixed to the second surface, any two neighboring supporting units respectively defining holes that have openings facing toward each other and communicating with each other; and
    a movable unit passing through the holes, the movable unit being movable relative to the supporting units along a direction from the opening of one hole towards the opening of an adjacent hole communicating the one hole;
    wherein a shape of the display unit is changed by adjusting a position relationship between the movable unit and the supporting units, and
    wherein the movable unit comprises:
        a flexible base made from an elastic material and arranged opposite to the display unit; and
        a plurality of rigid elements arranged at intervals along a direction parallel to the supporting units and fixedly connected to the flexible base, an interval between adjacent supporting units being smaller than a width of the rigid element in the interval direction, when the rigid elements are respectively and correspondingly received in the holes, a bending degree of the flexible display device is changeable.

2. The flexible display device of claim 1, wherein the movable unit further comprises:
    a driving unit arranged at a distal end of the flexible base to pull the flexible base to move the rigid elements relative to the supporting units.

3. The flexible display device of claim 1, wherein an end of the movable unit is fixed to an end of the display unit, and another end of the movable unit is in a free state, the flexible base is elastically stretchable and shrinkable.

4. The flexible display device of claim 1, wherein both ends of the movable unit are in a free state.

5. The flexible display device of claim 1, wherein when two opposite sides of each of the rigid elements are received in the holes of two adjacent supporting units, a bending degree of the flexible display device remains unchanged.

6. The flexible display device of claim 1, wherein distances between two adjacent supporting units gradually increase from the middle to both ends of the display unit.

7. The flexible display device of claim 6, wherein the supporting units and the rigid elements are corresponding to each other, and the distance between two adjacent supporting units is the same as that between corresponding two adjacent rigid elements.

8. The flexible display device of claim 6, wherein the plurality of supporting units at least comprises:
    two first supporting blocks located at two opposite side edges of the display unit; and
    a second supporting block arranged between the two first supporting blocks and arranged in a middle position of a long side or a short side.

9. The flexible display device of claim 8, wherein the plurality of supporting units further comprise at least one third supporting block arranged between the first supporting blocks and the second supporting block.

10. The flexible display device of claim 9, wherein a distance between the first supporting block and the third blocking block is larger than that between the second supporting block and the third blocking block.

11. An electronic device, comprising:
    a housing; and
    a flexible display device, comprising:
    a display unit comprising a first surface for display and a second surface opposite to the first surface;
    a support mechanism comprising:
    a plurality of supporting units arranged at intervals in a direction of a side edge of the display unit and fixed to the second surface, any two neighboring supporting units respectively defining holes that have openings facing toward each other and communicating with each other; and
    a movable unit passing through the holes, the movable unit being movable relative to the supporting units along a direction from the opening of one hole towards the opening of an adjacent hole communicating the one hole,
    wherein a shape of the display unit is changed by adjusting a position relationship between the movable unit and the supporting units;
    wherein, the housing is opposite to the display device, and
    wherein the movable unit comprises:
        a flexible base made from an elastic material and arranged opposite to the display unit; and
        a plurality of rigid elements arranged at intervals along a direction parallel to the supporting units and fixedly connected to the flexible base, an interval between adjacent supporting units being smaller than a width of the rigid element in the interval direction, when the rigid elements are respectively and correspondingly received in the holes, a bending degree of the flexible display device is changeable.

12. The electronic device of claim 11, further comprising:
    a control means electrically coupled to the flexible display device;
    wherein the control means transmits a control signal generated by the control means to the flexible display device to change the shape of the flexible display device.

13. The electronic device of claim 12, further comprising:
    a sensor electrically coupled to the control means;
    wherein the sensor generates a sensing signal and transmits the sensing signal to the control means, and the control means transmits a corresponding control signal to the flexible display device based on the sensing signal.

14. The electronic device of claim 13, wherein the sensor is a touch module or a shooting means.

15. The flexible display device of claim 1, wherein all of the rigid elements move along the same direction when the movable unit moves relative to the supporting units.

16. The flexible display device of claim 1, wherein the movable unit is movable relative to the supporting units in a first position where the flexible display device is bendable, and a second position where the flexible display device is fixed and non-bendable.

17. The flexible display device of claim 1, wherein the movable unit comprises a flexible base made from an elastic material and arranged opposite to the display unit passing through the holes.

18. A flexible display device, comprising:
   a display unit comprising a first surface for display and a second surface opposite to the first surface;
   a support mechanism comprising:
   a plurality of supporting units arranged at intervals in a direction of a side edge of the display unit and fixed to the second surface, any two supporting units respectively defining holes that have openings facing toward each other and communicating with each other; and
   a movable unit passing through the holes and movable relative to the supporting units;
   wherein a shape of the display unit is changed by adjusting a position relationship between the movable unit and the supporting units; and
   wherein the plurality of supporting units at least comprises:
   two first supporting blocks located at two opposite side edges of the display unit; and
   a second supporting block arranged between the two first supporting blocks and arranged in a middle position of a long side or a short side, and
   wherein the movable unit comprises:
      a flexible base made from an elastic material and arranged opposite to the display unit; and
      a plurality of rigid elements arranged at intervals along a direction parallel to the supporting units and fixedly connected to the flexible base, an interval between adjacent supporting units being smaller than a width of the rigid element in the interval direction,
      when the rigid elements are respectively and correspondingly received in the holes, a bending degree of the flexible display device is changeable.

* * * * *